(12) United States Patent
Block et al.

(10) Patent No.: US 8,114,780 B2
(45) Date of Patent: Feb. 14, 2012

(54) METHOD FOR DIELECTRIC MATERIAL REMOVAL BETWEEN CONDUCTIVE LINES

(75) Inventors: Mayumi Block, Sunnyvale, CA (US); Robert C. Hefty, Fremont, CA (US); Stephen M. Sirard, San Jose, CA (US); Kenji Takeshita, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 547 days.

(21) Appl. No.: 12/413,159

(22) Filed: Mar. 27, 2009

(65) Prior Publication Data

US 2010/0248485 A1    Sep. 30, 2010

(51) Int. Cl.
*H01L 21/302* (2006.01)
*H01L 21/461* (2006.01)

(52) U.S. Cl. .............. 438/704; 216/57; 216/83; 216/87; 216/99; 438/705

(58) Field of Classification Search ............... 216/57, 216/99, 83, 13; 438/704, 705
See application file for complete search history.

(56) References Cited

U.S. PATENT DOCUMENTS 6,025,273 A * 2/2000 Chen et al. ................ 438/706

* cited by examiner

*Primary Examiner* — Roberts Culbert
(74) *Attorney, Agent, or Firm* — Beyer Law Group LLP

(57) ABSTRACT

A method of removing carbon doped silicon oxide between metal contacts is provided. A layer of the carbon doped silicon oxide is converted to a layer of silicon oxide by removing the carbon dopant. The converted layer of silicon oxide is selectively wet etched with respect to the carbon doped silicon oxide and the metal contacts, which forms recess between the metal contacts.

19 Claims, 3 Drawing Sheets

METHOD FOR DIELECTRIC MATERIAL REMOVAL BETWEEN CONDUCTIVE LINES

BACKGROUND OF THE INVENTION

The present invention relates to forming semiconductor devices. More specifically, the present invention relates removing dielectric material between conductive lines.

During semiconductor wafer processing, it is sometimes desirable to remove dielectric material from between metal lines. The dielectric material may be carbon doped silicon oxide, such as organosilicate glass (OSG), Black Diamond from Applied Materials, Aurora from ASM International N.V, and Coral from Novellus Systems. The carbon doping lowers the capacitance or dielectric constant (k). A lower capacitance dielectric may be used to replace the removed carbon doped silicon oxide, to further reduce capacitance.

SUMMARY OF THE INVENTION

To achieve the foregoing and in accordance with the purpose of the present invention, in one embodiment, a method of removing carbon doped silicon oxide between metal contacts is provided. A layer of the carbon doped silicon oxide is converted to a layer of silicon oxide by removing the carbon dopant. The converted layer of silicon oxide is selectively wet etched with respect to the carbon doped silicon oxide and the metal contacts, which forms recess between the metal contacts.

In another manifestation of the invention, a method for removing carbon doped silicon oxide between metal contacts is provided. A layer of the carbon doped silicon oxide is converted to a layer of silicon oxide by removing the carbon dopant. The converted layer of silicon oxide is selectively wet etched with respect to the carbon doped silicon oxide, using an etchant comprising hydrogen fluoride, which forms recess between the metal contacts with an aspect ratio of at least 1, wherein the metal contact is exposed to the wet etch. The carbon doped silicon oxide is dry etched using the metal contacts as a mask after the wet etching to form the recesses into features.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
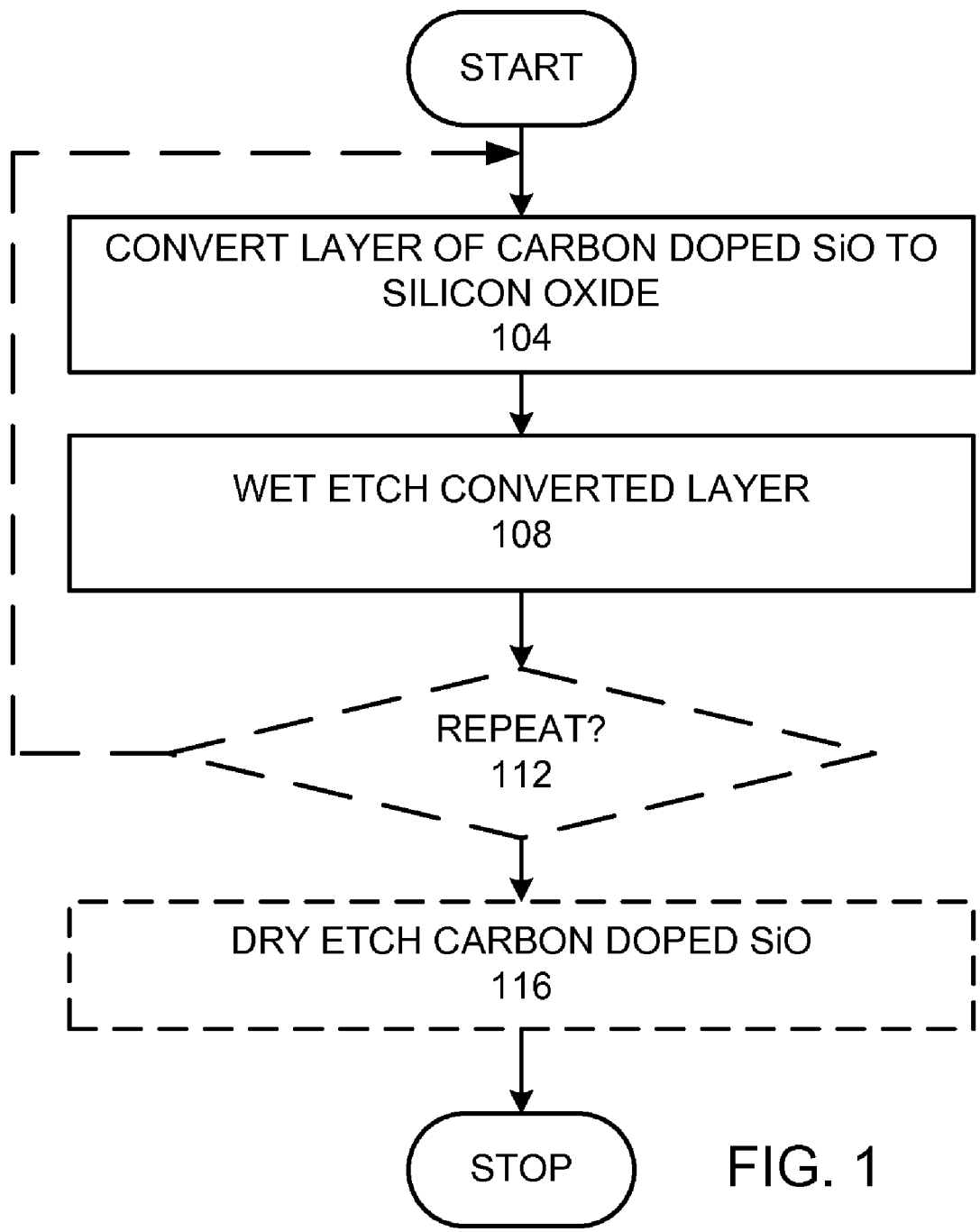
FIG. 1 is a high level flow chart of an embodiment of the invention.

To facilitate understanding, FIG. 1 is a high level flow chart of a process used in an embodiment of the invention for removing carbon doped silicon oxide between metal contacts. A layer of the carbon doped silicon oxide is converted to silicon oxide by removing the carbon dopant (step 104). A wet etch is provided to etch away the converted layer of silicon oxide, which forms recesses between the metal contacts (step 108).

Optional additional steps may be performed. One optional step is to repeat the above steps (step 112) at least one additional time.

An alternative optional step would be to perform a subsequent dry etch of the carbon doped silicon oxide layer using the metal contacts as a mask (step 116). A subsequent step may be to fill the recesses with a dielectric material with a lower capacitance than the carbon doped silicon oxide.

EXAMPLE

Figure 2A:
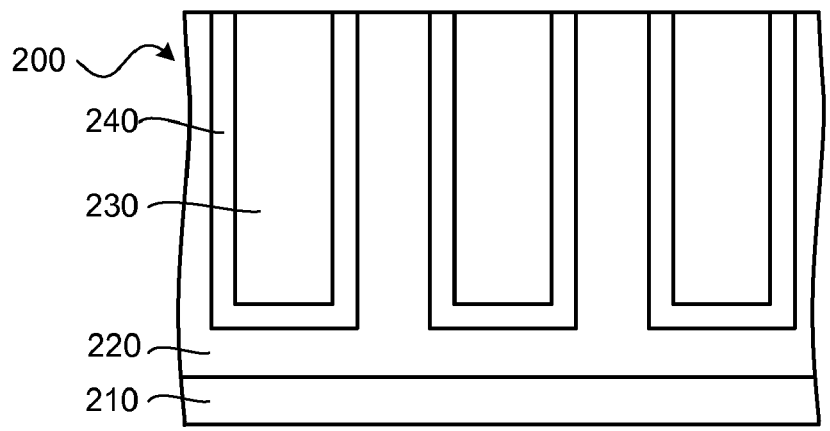
FIGS. 2A-D are schematic views of a stack processed according to an embodiment of the invention.

To facilitate understanding in an example of the invention, FIGS. 2A-D are schematic cross-sectional views of part of a stack 200 processed according to an embodiment of the invention. FIG. 2A is a schematic cross-sectional illustration of a stack 200 with a substrate 210, which may be a wafer or some other layer, over which an interlayer dielectric (ILD) 220 of carbon doped silicon oxide is provided. In this example, the carbon doped silicon oxide is organosilicate glass. In other embodiments, the carbon doped silicon oxide may be Black Diamond from Applied Materials, Aurora from ASM International N.V., and Coral from Novellus Systems. The carbon doping lowers the capacitance of the silicon oxide. Additional features, such as making the carbon doped silicon oxide porous, may be used to further lower the capacitance of the ILD. Metal contacts 230 are formed into the ILD 220. In this embodiment, the metal contacts are copper lines. In this embodiment, the copper lines have an adhesion or barrier layer 240. For example, a barrier layer 240 of tantalum/tantalum nitride is formed around the copper lines 230.

A layer of the ILD is converted to silicon oxide by removing most of the carbon dopant in the converted layer (step 104). Although most of the carbon dopant is removed from the converted silicon oxide layer, the converted silicon oxide layer may have other dopants. Preferably, almost all of the carbon dopant is removed from the converted layer. More preferably, almost all of the other dopants are removed from the converted silicon oxide layer.

Figure 2B:
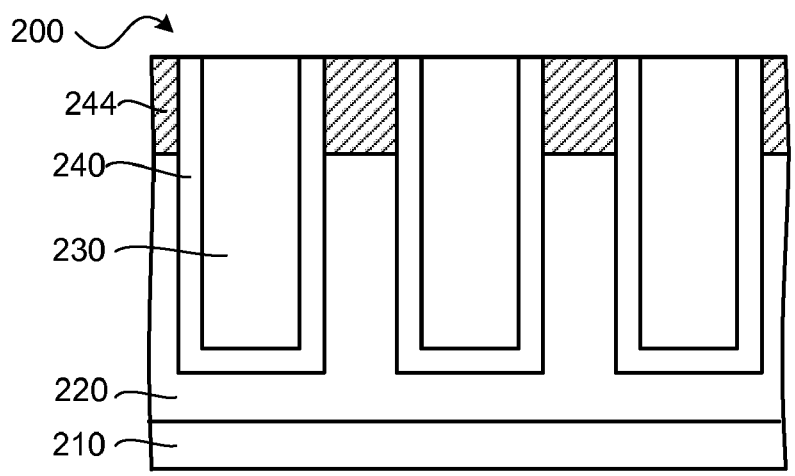

In one embodiment, an oxygen free plasma is used to convert the carbon doped silicon oxide. In this example, the recipe for the oxygen free plasma provides a flow of 600 sccm $H_2$ from a gas source into a plasma processing chamber. The chamber pressure is maintained at 120 mTorr. A radio frequency (RF) power of 60 MHz is provided at a power of 600 watts to an upper electrode, which is maintained at a temperature of 80° C. The substrate is supported on a lower electrode, which is maintained at a temperature of 20° C. The process is maintained for 30 seconds. Since no power is provided with either a DC bias to the lower electrode or at a low frequency, such as less than 27 MHz, and more preferably less than 2 MHz, this process has now bias power, making it a zero bias process. FIG. 2B shows a converted silicon oxide layer 244. In one embodiment, a non-etching oxygen free plasma is used to convert a layer of the ILD to silicon oxide to form the layer of converted silicon oxide 244.

In the preferred embodiment, the converted silicon oxide layer 244 has a uniform thickness. More preferably, the converted silicon oxide layer 244 has a controlled uniform thickness. In the specification and claims, a uniform thickness is defined as a thickness with a variation of less than 10%. In the specification and claims, a controlled uniform thickness is defined as a uniform thickness that may be controlled with an accuracy of 20% of the actual depth.

In another embodiment, a UV lamp is used to provide a UV exposure to provide a controlled uniform converted silicon oxide layer. In another embodiment, a down stream microwave stripper is used to provide the converted silicon oxide layer. The downstream microwave stripper provides neutral radicals such as hydrogen radicals. In another embodiment an inductive capacitive plasma (ICP) process using an ICP chamber is used to provide the converted silicon oxide layer. Preferably, such conversion processes do not etch the ILD layer. More preferably, such conversion processes use zero bias, to prevent etching of the ILD layer.

In these examples, the copper is exposed to the conversion process. It should be noted that a portion of the ILD 220 under the converted silicon oxide layer 244 remains unconverted.

A wet etch is used to remove the converted layer of silicon oxide (step 108). A hydrogen fluoride based wet etch may be used in an embodiment of the invention. An example of a recipe for wet etching the converted layer is performed by dipping the sample into 100:1 DI-HF liquid for 60 seconds. Preferably, the wet etch selectively etches the converted silicon oxide with respect to the carbon doped silicon oxide without damaging the metal contact.

Figure 2C:
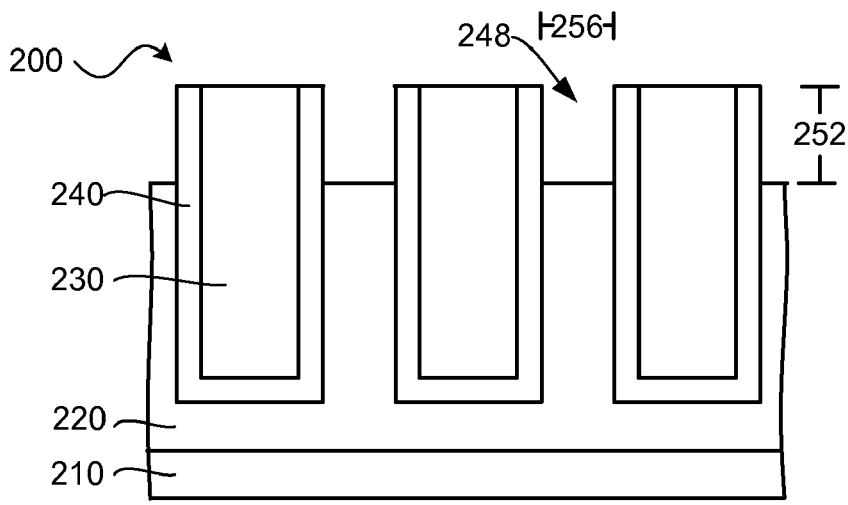

FIG. 2C shows the stack 200 after the wet etch. In this embodiment, the converted layer of silicon oxide has been removed, while the unconverted part of ILD remains unetched. Both the copper contacts 230 and the barrier layers 240 are exposed during the wet etch. The removal of the converted layer forms features 248 between the metal contacts, which may be metal lines. In this embodiment, these features 248 have an aspect ratio (ratio of depth to width) of greater than 1, since the depth 252 of the features 248 are greater than the width 256 of the features 248. In this example, the depth of the features is controlled and uniform, because the conversion is controlled and uniform. This is because the controlled and uniform thickness of the conversion of the carbon doped silicon oxide to a layer of silicon oxide, allows a wet etch removal of a controlled uniform layer of the ILD, using a wet etch that does not damage the copper contacts or the barrier layers.

Optional subsequent steps may be provided to further process the stack. In one example, the conversion step and wet etch steps are cyclically repeated one or more times to further etch the ILD in a uniformed and controlled manner.

In another embodiment, a plasma etching process is used to further etch the ILD using the metal contacts as a mask. In one embodiment of the plasma etch, a deposition layer is selectively formed over the tops of the contacts with respect to the bottoms of the features during the etch process, to selectively protect the metal contacts. In one embodiment, the deposition and etch are performed in a single step. In another embodiment, a plurality of cyclical alternating steps of deposition and etching are provided. In a more specific example, the deposition steps have a different gas chemistry than the etching steps, so that the gas is modulated between the deposition steps and the etching steps. In an embodiment of the invention, the selective deposition on top of the metal contacts with respect to the bottom of the features, is more selective when the aspect ratios (the ratio of the depth of the feature with respect to the width of the feature) of the features formed by the wet etch is greater than one. Therefore, in this embodiment, one of the benefits of providing the converting and wet etching before the dry etch is to provide features with an aspect ratio of greater than 1 to allow for the dry etch to be more selective.

Figure 2D:
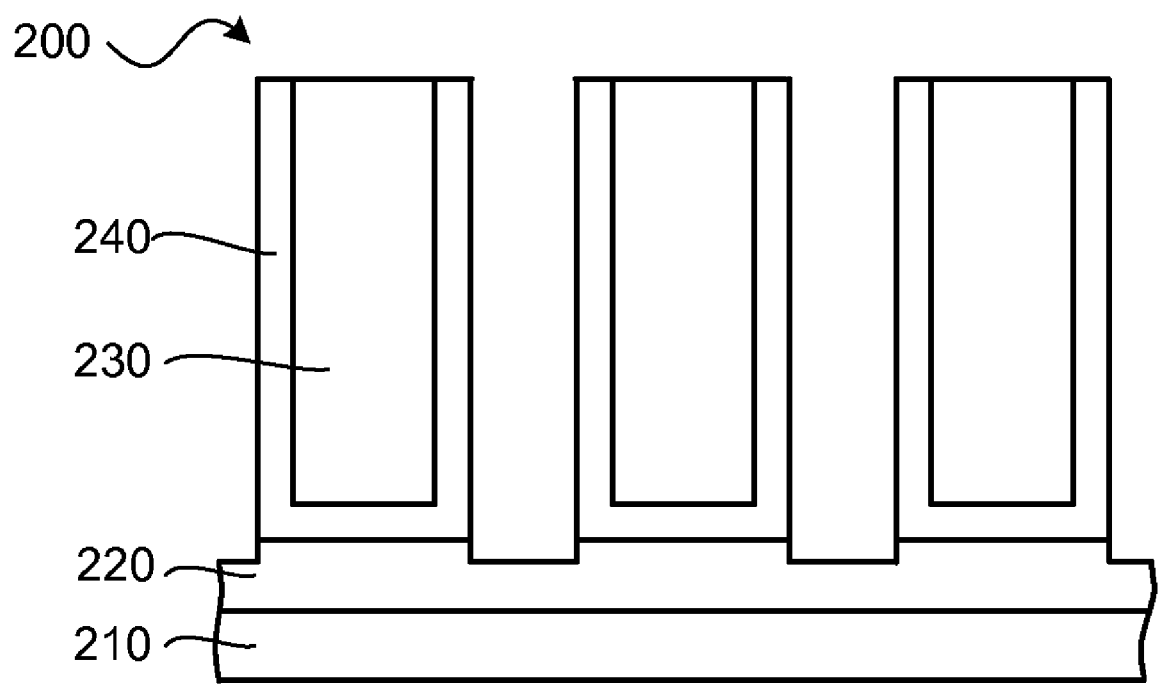

An example of such a selective plasma etch provides 4 cycles, where each cycle comprise a 3 second deposition and a 7 second etch. The deposition provides a chamber pressure of about 85 mTorr. A gas flow of 350 sccm $CH_3F$, 175 sccm $N_2$, and 500 sccm Ar is provided from a gas source to a plasma chamber. A 60 MHz RF power is provided at 300 Watts. The etch provides a chamber pressure of about 30 mTorr. A gas flow of 130 sccm $CF_4$ is provided to the chamber. A 60 MHz RF power is provided at 300 Watts. After the 4 cycles are completed a series of 15 cycles is provided where each cycle comprises a 2 second $CF_4$ and $H_2$ process followed by a 3 second $CO_2$ process. The $CF_4$ and $H_2$ process provides a chamber pressure of 75 mTorr. A 27 MHz RF power is provided at 1000 watts. A gas flow of 300 sccm Ar, 30 sccm $N_2$, 60 sccm $CF_4$, and 70 sccm $H_2$ is provided to the chamber. The $CO_2$ process provides a chamber pressure of 70 mTorr. A 27 MHz RF power is provided at 300 watts. A gas flow of 300 sccm $CO_2$ is provided to the chamber. FIG. 2D shows the stack after the ILD layer 220 has been further etched.

Further processing steps may fill the features with a lower capacitance dielectric or may use the features as air or vacuum gaps. The invention provides metal contacts supported by a low-k dielectric ILD of a carbon doped silicon oxide, with a lower-k dielectric placed between the metal contacts to provide a further reduced capacitance. An example of a low-k dielectric would have a k value less than 3.0. An example of a lower-k dielectric would have a k value less than 2.5. Such a resulting structure has less damage to the metal contacts, since the conversion and wet etch process lowers damage to the metal contacts. Without removing the carbon, it would be more difficult to wet etch the carbon doped silicon oxide. The presence of the carbon doped silicon oxide allows the remaining ILD to have a low k. This process also reduces undercutting by providing a self mask.

In other embodiments, the metal contact or barrier layer may comprise cobalt or aluminum.

While this invention has been described in terms of several preferred embodiments, there are alterations, permutations, modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for removing carbon doped silicon oxide between metal contacts, comprising:
    (a) converting a layer of the carbon doped silicon oxide to a layer of silicon oxide by removing the carbon dopant; and
    (b) selectively wet etching the converted layer of silicon oxide with respect to the carbon doped silicon oxide and the metal contacts, which forms recess between the metal contacts.

2. The method, as recited in claim 1, wherein the metal contact is exposed to the wet etch.

3. The method, as recited in claim 2, further comprising dry etching the carbon doped silicon oxide using the metal contacts as a mask after the wet etching.

4. The method, as recited in claim 3, wherein the wet etching forms features with an aspect ratio of at least 1.

5. The method, as recited in claim 4, wherein the wet etching uses an etchant comprising hydrogen fluoride.

6. The method, as recited in claim 5, wherein the converting the layer comprises exposing the carbon doped silicon oxide to a zero bias process.

7. The method, as recited in claim 6, wherein the zero bias process is nonetching and is at least one of a UV exposure process, a downstream microwave stripper process, a plasma exposure process, or an ICP plasma process.

8. The method, as recited in claim 7, wherein the metal contacts are copper containing contacts with a barrier layer, wherein the copper containing contacts are exposed to the converting the layer of carbon doped silicon oxide and the wet etching, and wherein the converting the layer of carbon doped silicon oxide is an oxygen free process.

9. The method, as recited in claim 8, wherein the converting the layer of carbon doped silicon oxide converts the carbon doped silicon oxide to a controlled depth, so that a portion of the carbon doped silicon oxide is not converted and lies below the converted carbon doped silicon oxide.

10. The method, as recited in claim 9, wherein the metal contacts form metal lines.

11. The method, as recited in claim 1, wherein the converting the layer of carbon doped silicon oxide converts the carbon doped silicon oxide to a controlled depth, so that a portion of the carbon doped silicon oxide is not converted and lies below the converted carbon doped silicon oxide and wherein steps a and b are cyclically repeated a plurality of times.

12. The method, as recited in claim 1, wherein the wet etching uses an etchant comprising hydrogen fluoride.

13. The method, as recited in claim 1, wherein the converting the layer comprises exposing the carbon doped silicon oxide to a zero bias process.

14. The method, as recited in claim 13, wherein the zero bias process is nonetching and is at least one of a UV exposure process, a downstream microwave stripper process, a plasma exposure process, or an ICP plasma process.

15. The method, as recited in claim 1, wherein the metal contacts are copper containing contacts with a barrier layer, wherein the copper containing contacts are exposed to the converting the layer of carbon doped silicon oxide and the wet etching, and wherein the converting the layer of carbon doped silicon oxide is an oxygen free process.

16. The method, as recited in claim 1, further comprising:
   dry etching the carbon doped silicon oxide using the metal contacts as a mask after the wet etching to form the recesses into features; and
   forming the features between the metal contacts into air or vacuum gaps.

17. The method, as recited in claim 1, further comprising:
   dry etching the carbon doped silicon oxide using the metal contacts as a mask after the wet etching to form the recesses into features; and
   filling the features between the metal contacts with a dielectric material with a lower k value than a k value for the carbon doped silicon oxide.

18. A method for removing carbon doped silicon oxide between metal contacts, comprising:
   (a) converting a layer of the carbon doped silicon oxide to a layer of silicon oxide by removing the carbon dopant;
   (b) selectively wet etching the converted layer of silicon oxide with respect to the carbon doped silicon oxide, using an etchant comprising hydrogen fluoride, which forms recess between the metal contacts with an aspect ratio of at least 1, wherein the metal contact is exposed to the wet etch; and
   (c) dry etching the carbon doped silicon oxide using the metal contacts as a mask after the wet etching to form the recesses into features.

19. The method, as recited in claim 18, further comprising filling the features between the metal contacts with a dielectric material with a lower k value than a k value for the carbon doped silicon oxide.

* * * * *